United States Patent
Takiar et al.

[11] Patent Number: 5,914,528
[45] Date of Patent: *Jun. 22, 1999

[54] THERMALLY-ENHANCED LEAD FRAME WITH REDUCED THERMAL GAP

[75] Inventors: Hem P. Takiar, Fremont; Kuan L. Chen, San Jose, both of Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/847,700

[22] Filed: Apr. 28, 1997

Related U.S. Application Data

[60] Provisional application No. 60/016,662, May 1, 1996.
[51] Int. Cl.⁶ .......................... H01L 23/495; H01L 23/34
[52] U.S. Cl. .......................... 257/666; 257/676; 257/698; 257/669
[58] Field of Search .................................. 257/666, 669, 257/670, 672, 676, 698, 777, 773, 776

[56] References Cited

U.S. PATENT DOCUMENTS

| | | |
|---|---|---|
| 4,307,297 | 12/1981 | Groff al. ................................. 257/666 |
| 4,390,598 | 6/1983 | Phy ........................................... 257/666 |
| 4,797,726 | 1/1989 | Manabe .................................... 257/669 |
| 4,924,291 | 5/1990 | Lesk et al. ............................... 257/669 |
| 5,229,846 | 7/1993 | Kozuka .................................... 257/666 |
| 5,247,202 | 9/1993 | Popovic et al. ......................... 257/666 |
| 5,329,157 | 7/1994 | Rosotker .................................. 257/666 |
| 5,428,246 | 6/1995 | Westerkamp ............................ 257/691 |
| 5,434,750 | 7/1995 | Rostoker et al. ........................ 257/666 |
| 5,468,993 | 11/1995 | Tani ........................................ 257/669 |
| 5,633,528 | 5/1997 | Abbott et al. ........................... 257/666 |
| 5,637,913 | 6/1997 | Kajihara et al. ........................ 257/666 |
| 5,640,044 | 6/1997 | Takehashi et al. ...................... 257/666 |
| 5,661,338 | 8/1997 | Yoo et al. ................................ 257/670 |

*Primary Examiner*—Alexander Oscar Williams
*Attorney, Agent, or Firm*—Limbach & Limbach L.L.P.

[57] ABSTRACT

A lead frame structure includes a lead frame skeleton and at least one die bar connected between the lead frame skeleton and a non-quadrangular die attach paddle. Each of a plurality of leads has an outer edge connected to the lead frame skeleton and an inner edge disposed adjacent to but separated from the periphery of the die attach paddle. Preferably, the inner edge of each lead is separated from the periphery of the die attach paddle by about 5–10 mils.

2 Claims, 5 Drawing Sheets

THERMALLY-ENHANCED LEAD FRAME WITH REDUCED THERMAL GAP

RELATED APPLICATION

This application claims the benefit of U.S. Provisional Application Ser. No. 60/016,662, filed May 1, 1996, titled "Thermally-Enhanced Plastic Package Design for Plastic Integrated Circuit Package."

BACKGROUND OF THE INVENTION

1. Field of the Invention

The present invention relates to packaging for semiconductor integrated circuits and, in particular, to a plastic package design that uses a non-quadrangular die attach paddle to provide heat dissipation capability comparable to that of a plastic package with a heat spreader, but at lower cost.

2. Discussion of the Related Art

Currently-available high-speed, high-density integrated circuit devices can generate large amounts of heat. The heat generated by these devices must be removed because the normal integrated circuit failure mechanisms are usually enhanced by increased temperature. Therefore, to prevent reliability and performance problems, the temperature of integrated circuit chips must be kept within specified limits.

FIG. 1 shows a design of a conventional copper lead frame structure 10. The lead frame structure 10 includes a supporting skeleton (not shown) that serves to support the integrity of the remaining elements of the structure 10 during the attachment of a semiconductor die and other manufacturing steps. Typically, the lead frame skeleton supports die attach and lead structures for a plurality of integrated circuit devices. The lead frame skeleton may be in the form of a lead frame strip or a reel-to-reel lead frame configuration for automated processing.

As further shown in FIG. 1, the conventional lead frame structure includes a die attach paddle (DAP) 12 that is usually formed as a solid square or, in some circumstances, can be a solid rectangular. The DAP 12 is attached to the lead frame skeleton by four tie bars 14 that extend from the corners of the quadrangular DAP structure 12. The lead frame structure also includes a plurality of leads 16 with each lead 16 having an outer edge 18 connected to the lead frame skeleton and an inner edge 20 disposed adjacent to but separated from the periphery of the die attach paddle 12. In the FIG. 1 design, the space between the edge of the DAP 12 and the closest inner lead edge 30 is 0.044 inches. FIG. 1 shows a so-called high lead count package that includes 160 leads 18, 40 leads 18 disposed on each side of the solid square die attach paddle 12.

Typically, the lead frame structure 10 will also includes dam bars (now shown) which maintain the physical integrity of the leads 16 during processing, but which are removed before the completion of the final packaging process in order to provide individual electrical integrity to the leads 16.

Die attach techniques other than the solid DAP design described above have been utilized.

For example, Motorola's U.S. Pat. No. 4,924,291, issued May 8, 1990, discloses a so-called "flagless" semiconductor package in which the die attach paddle is completely eliminated and the semiconductor die is mounted directly to the inner ends of the lead frame tie bars. The Motorola '291 patent also discloses an embodiment in which a guard ring is utilized to maintain the structural integrity of the bars to which the semiconductor die is attached.

FIGS. 2–5 show other known die attach systems. In each of FIGS. 2–5, the semiconductor die is shown in "dashed" lines.

The system of the Motorola '291 patent and those shown in FIGS. 2–5 differ fundamentally from the FIG. 1 die attach system in that these systems do not utilize a "solid" quadrangular die attach paddle, i.e. a substantially flat four-sided DAP that is substantially devoid of openings within its four sides.

In plastic packages, the integrated circuit chip is mounted on the die attach paddle, wire bonded to the inner edges of the individual leads 16 and encapsulated in plastic molding. To meet temperature specifications, a heat spreader (not shown) can be placed under the chip to improve heat dissipation. Usually, the heat spreader is also copper, which increases the cost of the packaged product. Use of heat spreaders can also cause reliability problems.

It would, therefore, be desirable to enhance heat dissipation in integrated circuit devices, but at low cost, particularly in high pin count devices.

SUMMARY OF THE INVENTION

The heat dissipation path in integrated circuit devices is through the integrated circuit chip to the die attach paddle, then through the molding compound that fills the gap between the die attach paddle and the inner edges of the lead frame leads and through the leads to the external environment. We have found that, due to its low thermal conductivity, the mold compound formed in the gap between the die attach paddle and the inner edges of the lead frame has the most impact on heat dissipation.

The present invention provides for enhanced heat dissipation in plastic integrated circuit package design, without the need for a heat spreader, by utilizing a non-quadrangular die attach paddle that maintains the current "technology gap" (10 mils) between the die attach paddle and the inner lead edges. In a preferred embodiment, locking holes are provided at the periphery of the die attach paddle to facilitate the top-to-bottom molding interface.

In accordance with another aspect of the invention, heat dissipation is improved by downsetting the die attach paddle to provide a gap that is less than the 10 mil "technology gap. In many lead frame designs, this downset can be obtained by shearing the metal between the die attach paddle and the inner lead edges, rather than punching it out according to conventional techniques. After shearing, the gap in the x-y direction is substantially zero, while the gap in the z-direction will depend only upon the precision of the manufacturing technology in performing the shearing process. It is believed that a downset gap of about 5 mils will provide a thermal enhancement of about 10% for high lead count devices.

In some applications, for example, in T0220 packages that have leads on only one side of a downset die attach paddle, the downset can be reduced from the typical 25 mils to about 10 mils to achieve a 25% heat dissipation enhancement.

A better understanding of the features and advantages of the present invention will be obtained by reference to the following detailed description and accompanying drawings which set forth illustrative embodiments in which the concepts of the invention are utilized.

DETAILED DESCRIPTION OF THE INVENTION

Figure 6:
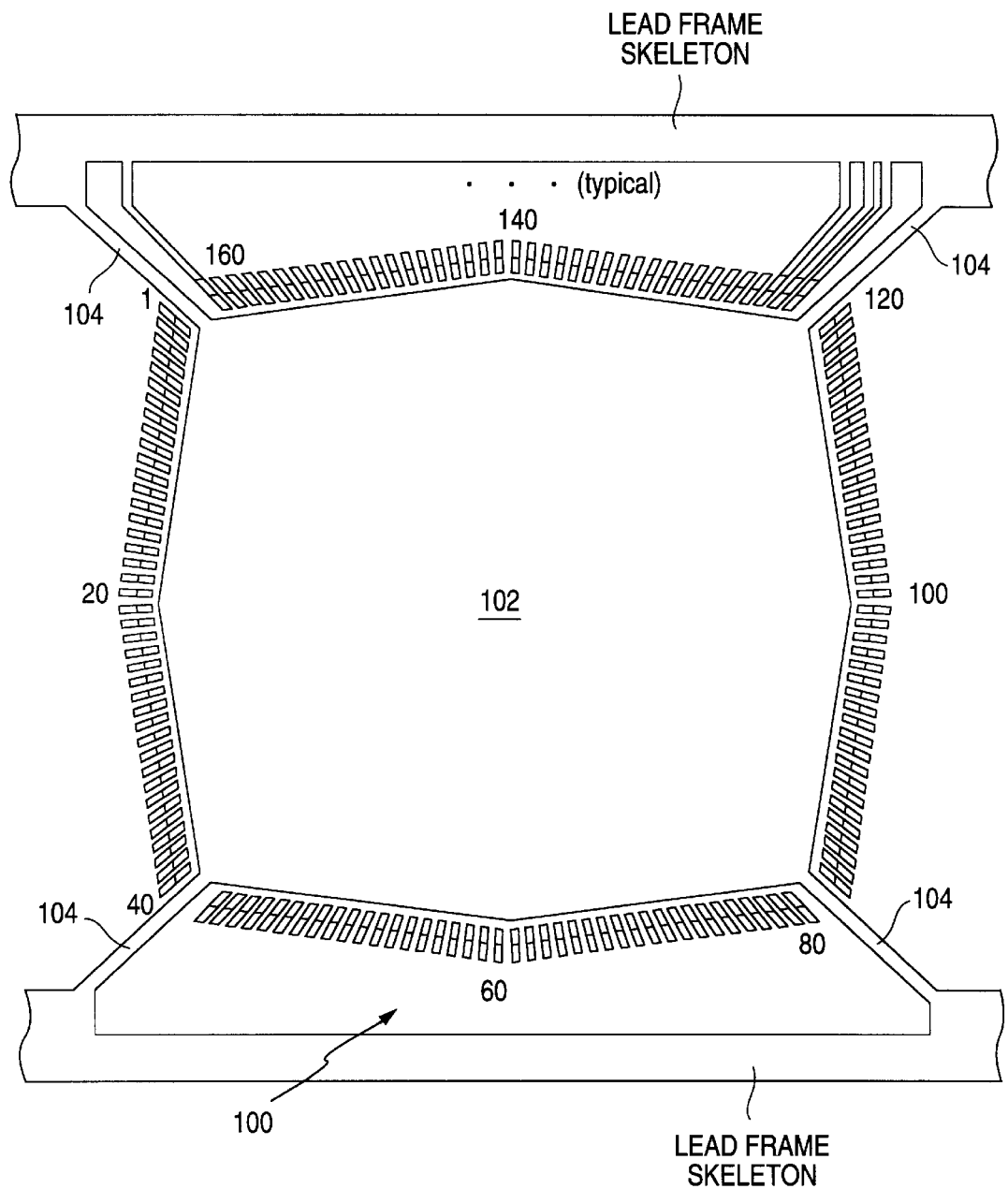
FIG. 6. is a plan view illustrating a lead frame structure in accordance with the invention.

FIG. 6 shows a lead frame structure 100 in accordance with the present invention. The lead frame structure includes a lead frame skeleton (not shown) that supports a die attach paddle 102 via tie bars 104 attached to the lead frame skeleton. In accordance with the present invention, the die attach paddle 102 is non-quadrangular (i.e., it does not have the classic four-sided shape utilized in prior art lead frame structures and illustrated in FIG. 1). Those skilled in the art will appreciate that, while the die attach paddle 102 shown in the FIG. 6 embodiment of the invention has eight sides, the concepts of the invention extend to other non-quadrangular shapes, including all shapes having more than four sides and shapes including curved perimeters.

The remainder of the lead frame structure 100 is conventional, that is, it includes a plurality of leads, where each lead has an outer edge connected to the lead frame skeleton and an inner edge disposed adjacent to but separated from the periphery of the die attach paddle. It can be seen from the FIG. 6 illustration, however, that the technology gap between the edge of the die attach paddle 104 and the inner edge of the leads has been substantially reduced, thereby reducing the heat dissipation path through molding compound of the finished plastic package structure. In the embodiment illustrated in FIG. 6, the space between the edge of the DAP 102 and the inner edge is a maximum 0.008 inches. Preferably, the inner edge of the lead is separated from the periphery of the die attach paddle 102 by no more than about 5–10 mils.

Figure 1:
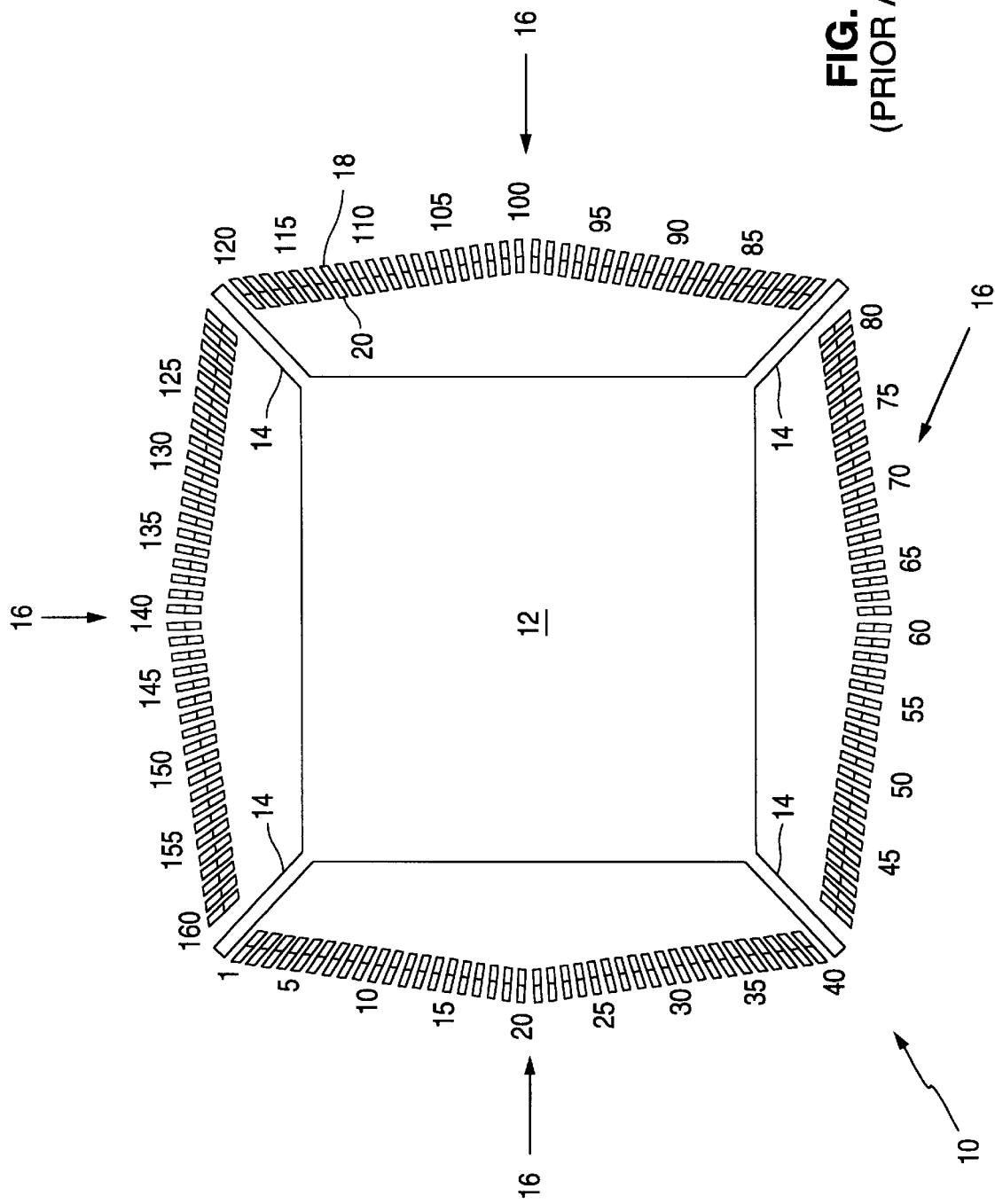
FIG. 1. is a plan view illustrating a conventional lead frame structure.
Figure 2:
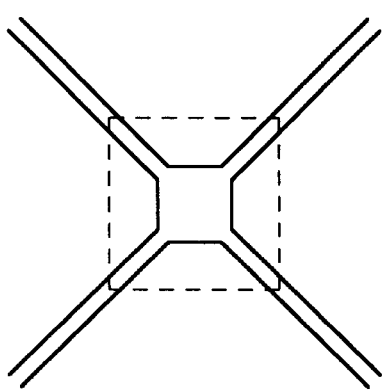
FIGS. 2–5 are plan views illustrating known die attach systems.
Figure 3:
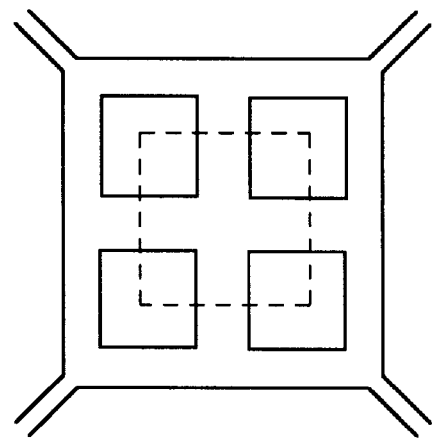
Figure 4:
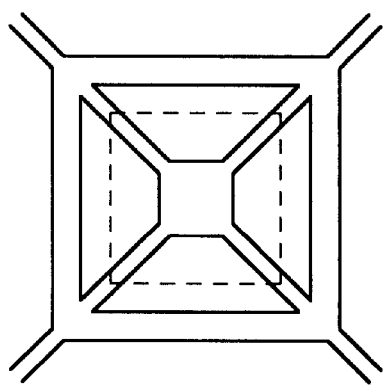
Figure 5:
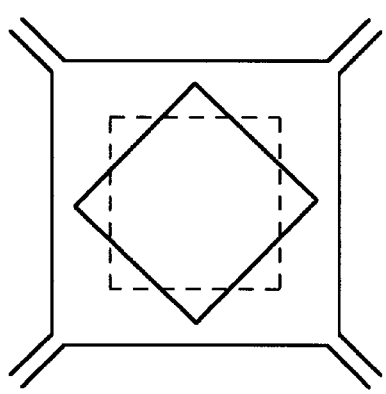
Figure 6A:
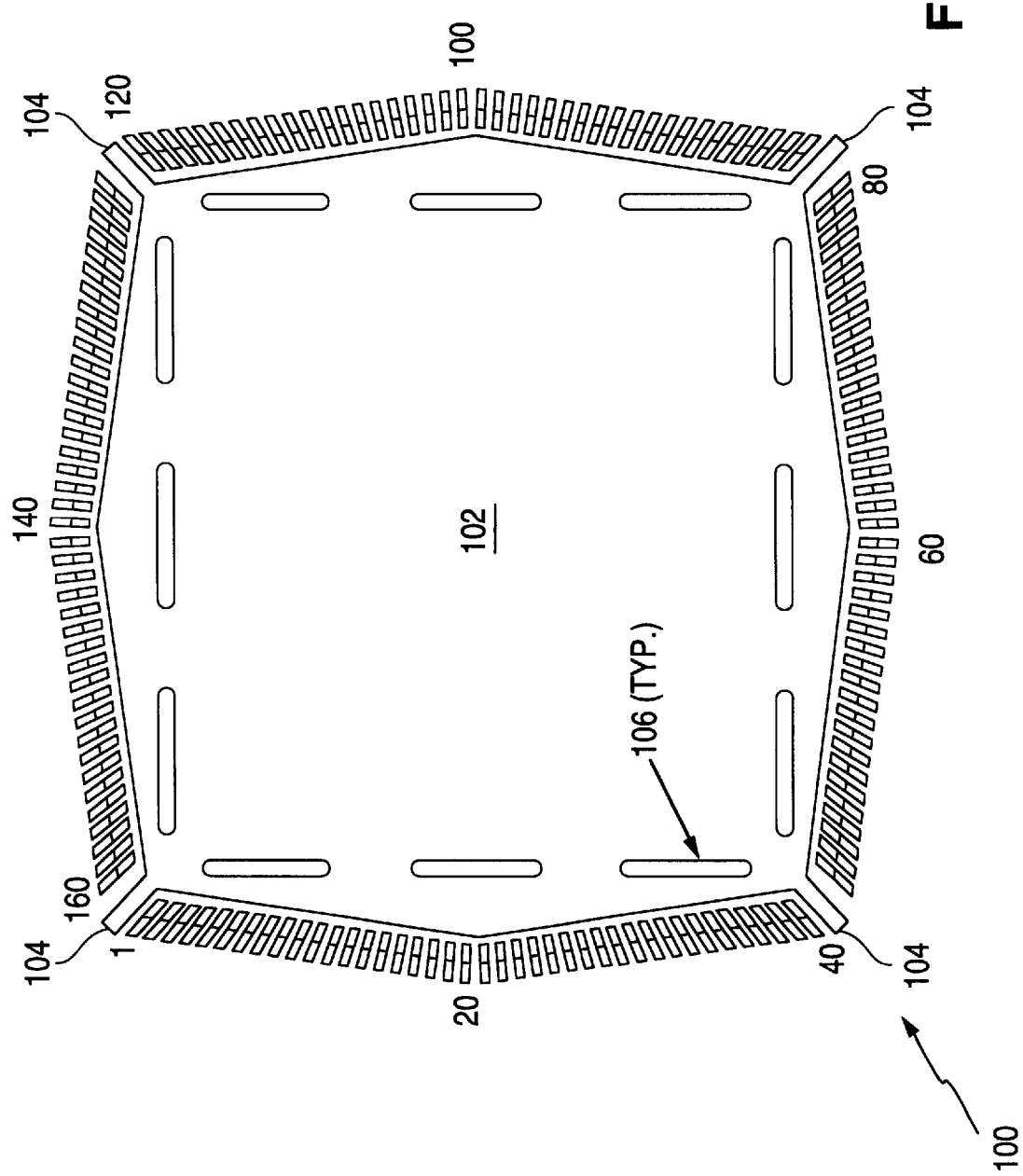
FIG. 6A is a plan view illustrating a preferred embodiment of a lead frame structure in accordance with the present invention.

Referring to FIG. 6A, one of the advantages of the prior art structure shown in FIG. 1, is that the gap between the inner lead edges and the die attach paddle allows for a strong interface between the top and bottom elements of the molded package. Reducing the gap can result in decreased physical integrity of the package due to the lack of appropriate interface.

Therefore, FIG. 6A shows an embodiment of the invention in which the non-quadrangular die attach paddle 102 includes locking holes 106 at its periphery. The function of the locking holes is to provide additional space to facilitate the top-to-bottom molding compound interface. In the FIG. 6A embodiment, the slots are 0.080 inches×0.10 inches, the space between the slots is 0.040 inches and the distance from the edge as the DAP 102 to the slot edge is 0.010. Those skilled in the art will appreciate that numbers of other slot geometries, sizes and locations are within the scope of the invention.

Figure 7A:
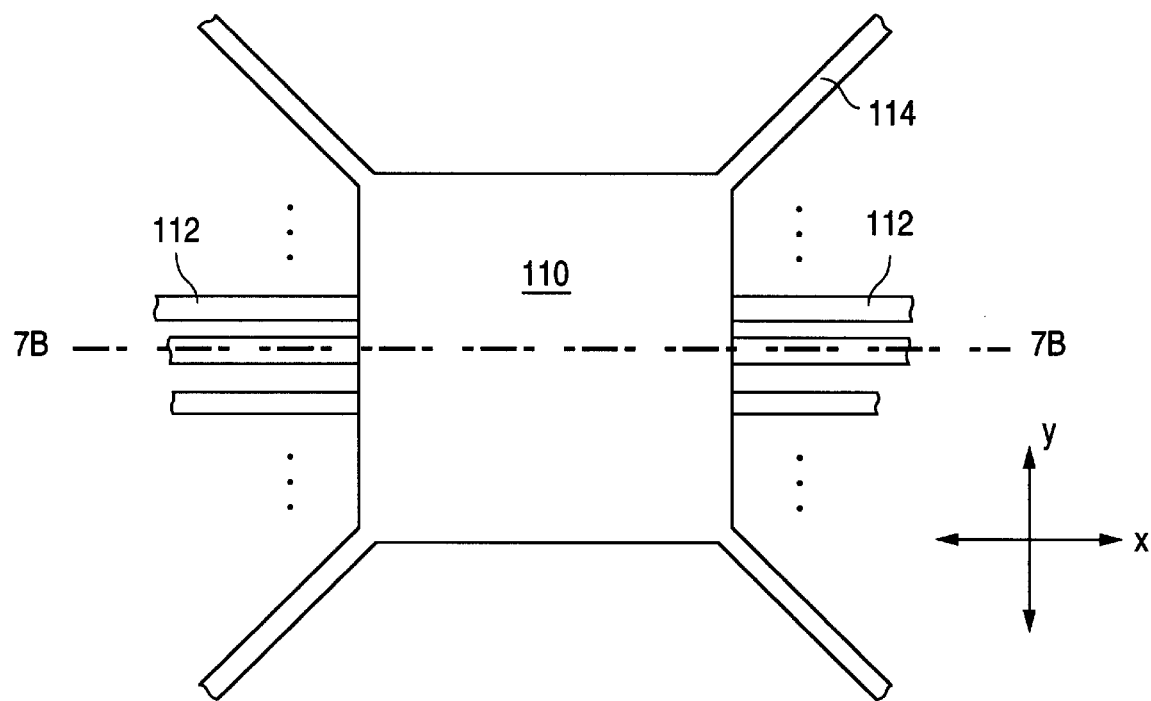
FIGS. 7A and 7B are, respectively, a plan view and a partial cross-section view of an alternative embodiment of a lead frame structure in accordance with the present invention.
Figure 7B:
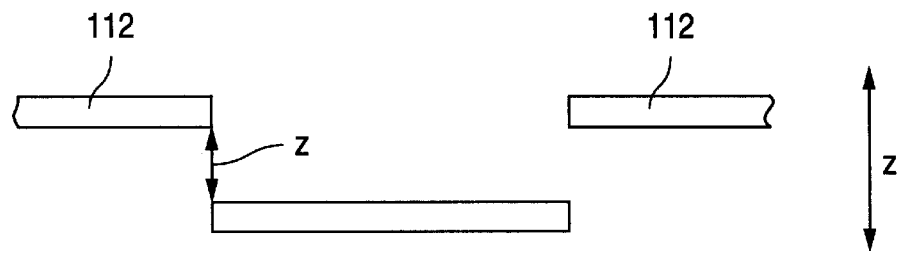

FIGS. 7A and 7B show an alternative embodiment of the present invention wherein, in separating the die attach paddle 110 from the leads 112 by shearing the metal at the interface between the die attach paddle 110 and the leads 112, while maintaining the integrity of the die bars 114, the gap between the leads 112 and paddle 110 in the x-y direction is substantially zero while the gap in the z-direction is less than 10 mils. As stated above, it is believed that presently-available shearing technology can produce such a "downset" gap (Z in FIG. 7) of about 5 mils for high lead count devices.

It should be understood that various alternatives to the embodiments of the invention described herein may be employed in practicing the invention. Thus, it is intended that the following claims define the scope of the invention and that structures within the scope of these claims and their equivalents be covered thereby.

What is claimed is:

1. A lead frame structure comprising:

a lead frame skeleton;

a die attach paddle;

at least one die bar connected between the die attach paddle and the lead frame skeleton; and a plurality of leads, each lead having an outer edge and an inner edge; and wherein separation between the inner edge of the leads and the periphery of the die attach paddle is substantially zero in the x-y plane and is less than 10 mils in the z-direction.

2. A lead frame structure as in claim 1, and wherein the separation between the leads and the die attach paddle in the z-direction is between 5–10 mils.

* * * * *